United States Patent [19]

Gilbert

[11] 4,268,759
[45] May 19, 1981

[54] SIGNAL-PROCESSING CIRCUITRY WITH INTRINSIC TEMPERATURE INSENSITIVITY

[75] Inventor: Barrie Gilbert, Forest Grove, Oreg.

[73] Assignee: Analog Devices, Incorporated, Norwood, Mass.

[21] Appl. No.: 40,594

[22] Filed: May 21, 1979

[51] Int. Cl.³ .................... G06G 7/12; G06G 7/20
[52] U.S. Cl. .................... 307/490; 307/310; 328/144
[58] Field of Search ............ 307/229, 230, 268, 260, 307/296, 254, 310; 328/144, 145

[56] References Cited

PUBLICATIONS

Electronic Letters, Precision Differential Voltage Current Generator, vol. 9 No. 6, 22 Mar. 1973.
Precision Differential Voltage Current Generator by Raimonodo Caprio, Electronic Letters, vol., 9 No. 6, Mar. 22, 1973, pp. 147 & 148.

Primary Examiner—Stanley D. Miller, Jr.
Assistant Examiner—B. P. Davis
Attorney, Agent, or Firm—Parmelee, Johnson, Bollinger & Bramblett

[57] ABSTRACT

Signal-processing circuitry including at least two pairs of bipolar transistors with the transistors of one pair being series-connected with the transistors of the second pair, and the second pair being cross-connected from collector-to-base. Other circuitry includes (1) an input arrangement for converting a single-ended input voltage to a complementary pair of currents, (2) a differential emitter-follower providing $2V_{BE}s$ of level-shifting, (3) means for obtaining an output signal proportional to the square of an input signal, and (4) a simple active rectifier.

16 Claims, 6 Drawing Figures

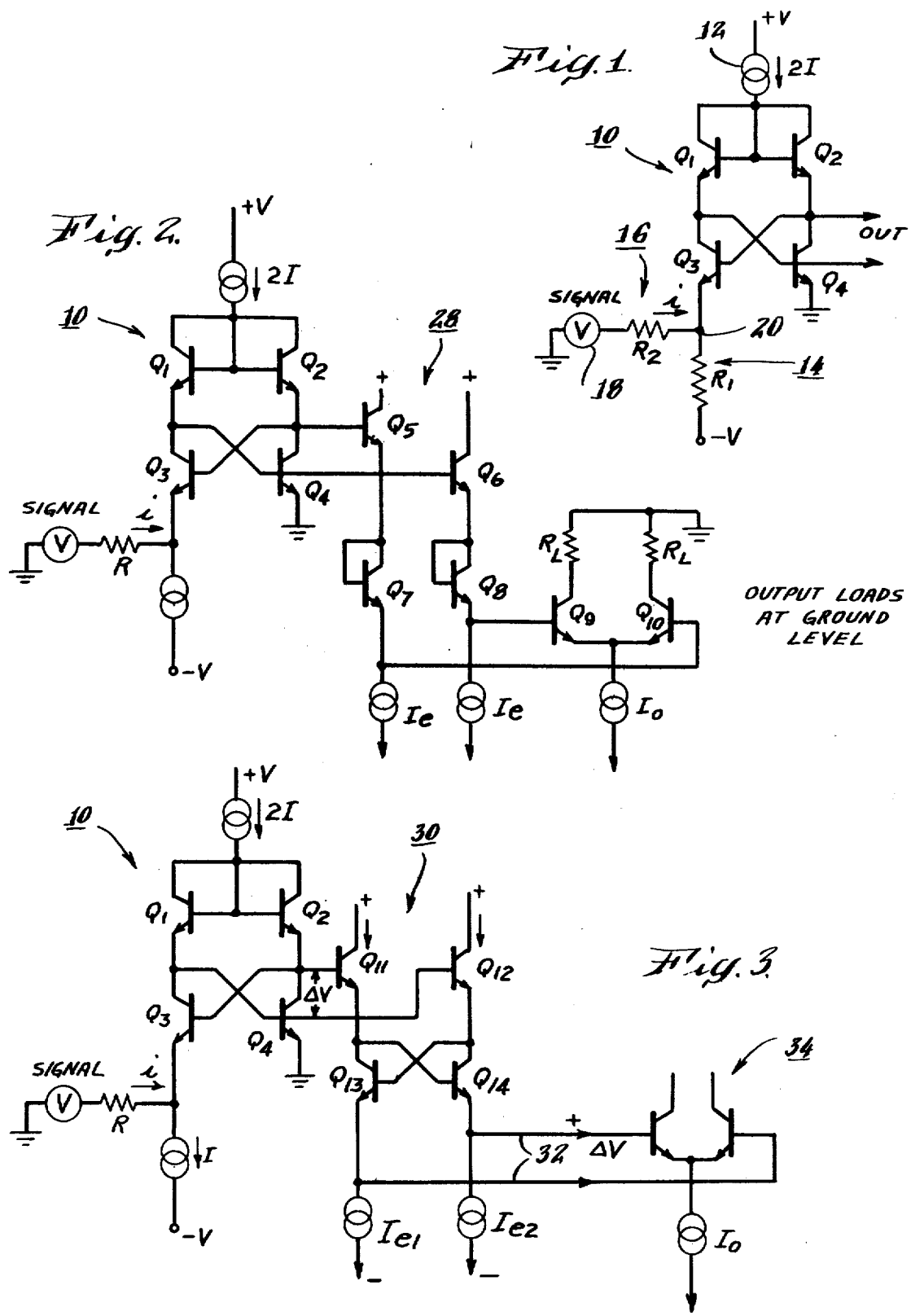

4,268,759

SIGNAL-PROCESSING CIRCUITRY WITH INTRINSIC TEMPERATURE INSENSITIVITY

BACKGROUND OF THE INVENTION

1. Field of the Invention

This invention relates to linear analog circuits suitable for applications such as voltage-to-current-converters, differential coupling stages, wideband squarers, rectifiers and the like. More particularly, this invention relates to analog circuits basically comprising four transistor junctions with cross-over collector-to-base interconnections between two of the transistors. Such circuits have been referred to as cross-quad circuits.

2. Description of the Prior Art

The circuits to be described herein are the type which make use of the linear relationship between the transconductance of a bipolar transistor and the collector current (thus giving rise to the name "translinear" circuits). Stated in an equivalent form, these circuits are based on the linear relationship between the base-emitter voltage and the logarithm of collector current. This linear relationship holds over many orders of magnitude for most present day small-signal transistors, and serves as the basis for a number of "non-linear" analog devices such as multipliers, dividers, squarers, rooters, and so on. The so-called translinear circuits are not confined to use in non-linear applications, and can for example provide a means for achieving very wide-band linear amplification. One of the important virtues of translinear circuits is in providing temperature-insensitive performance.

Translinear circuits operate entirely in the current domain (except for the ultimate interface with standard voltage-mode equipment), and are thus distinguishable from circuits the functioning of which involves a translation between $V_{BE}$ and collector current, requiring temperature compensation. Such voltages as do arise in a translinear circuit due to signals are very small (tens of millivolts usually) and of only incidental importance to operation of the circuit. Analytic procedures can be employed completely ignoring such voltages. The resulting functions are fundamentally exact algebraic expressions in which the basic device parameters do not appear explicitly, and which are insensitive to isothermal temperature variations over a wide range.

One basic aspect of a translinear circuit is that it involves the use of an even number of forward biased PN junctions arranged in loops around which the net voltage sums to zero, that is, there are as many junctions connected in one polarity as in the other. Many circuits have only a single loop, but loops may overlap, The PN junctions do not have to be the emitter-base junction of a bipolar transistor; in theory, two-terminal devices may be used, although in practice their accuracy may be inadequate.

SUMMARY OF THE INVENTION

Accordingly, it is an object of the present invention to provide improved analog circuits of the translinear class. A more specific object of the invention is to provide improved means for effecting interface between voltage-mode equipment and a translinear circuit, especially providing conversion from single-sided to differential-mode operation. Still another specific object is to provide a differential emitter-follower of very low output impedance. Yet another object is to provide an improved circuit effecting a squaring function. Other objects, aspects and advantages of the invention will in part be pointed out in, and in part apparent from, the following description of preferred embodiments of the invention considered together with the accompanying drawings.

BRIEF DESCRIPTION OF THE DRAWINGS

FIG. 1 shows a cross-quad translinear circuit providing a virtual-ground current-summing input node;

FIG. 2 shows the cross-quad circuit of FIG. 1 coupled to a level-shifting emitter-follower circuit driving a differential load at ground level;

FIG. 3 shows a cross-quad circuit driving a second cross-quad circuit;

DESCRIPTION OF PREFERRED EMBODIMENTS

Figure 5:
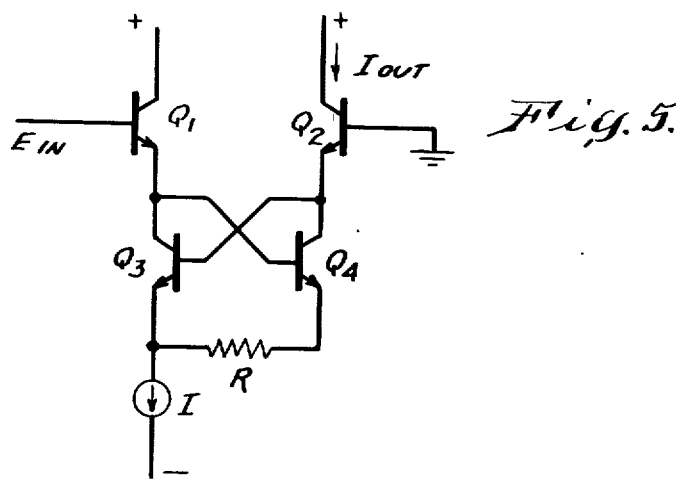
FIG. 5 shows a cross-quad circuit with a single-sided input voltage and providing a sharp break-point output characteristic.

Referring now to FIG. 1, there is shown a cross-quad circuit 10 including a first pair of matched transistors $Q_1$ and $Q_2$ having their collectors connected to their bases to form two-terminal diode junctions. The term "matched" in this context means that the transistors have the same emitter areas and the same junction characteristics, including the same saturation current; preferably, the transistors are formed on the same IC chip, together with the other transistors described below, and positioned to provide isothermal characteristics. The collector/base terminals of the two transistors are connected together, and are supplied with current from a constant-current source 12 furnishing a current designated as 2I, divided between the two transistor junctions.

The emitters of the transistors $Q_1$ and $Q_2$ are connected respectively to the collectors of a second pair of matched transistors $Q_3$ and $Q_4$. These collectors are cross-connected to the bases of the opposite transistors, i.e., the collector of transistor $Q_3$ is connected to the base of $Q_4$, and vice versa. The emitter of $Q_4$ is held at a fixed reference potential illustratively indicated as ground.

The circuit of FIG. 1 acts to hold the emitter terminal of transistor $Q_3$ effectively at the same potential as the emitter of transistor $Q_4$. This can best be understood by summing the $V_{BE}$ voltages of the four transistors starting at the emitter of $Q_4$, proceeding from the base of $Q_4$ to the emitter of $Q_1$, through $Q_1$ and $Q_2$, and then back through the $V_{BE}$ of $Q_3$. Since $Q_1$ and $Q_2$ are matched, and $Q_3$ and $Q_4$ are matched, then $V_{BE4} + V_{BE1} = V_{BE3} + V_{BE2}$. Consequently, the emitter of $Q_3$ must be at the same potential as the emitter of $Q_4$, i.e. ground, in the embodiment disclosed.

The emitter of $Q_3$ is connected to a constant-current source generally indicated at 14, and symbolically illustrated in FIG. 1 as a resistor $R_1$ with its remote end tied to a bias voltage $-V$ to produce a current of I through the resistor. An input circuit 16 also is connected to the emitter of $Q_3$, comprising an input resistor $R_2$ driven by an input voltage signal source 18 to produce an input current i. Thus, the $Q_3$ emitter terminal becomes a current-summing input node 20 which is held at a virtual ground potential.

With an input current i flowing into the node 20, and assuming infinite betas, the emitter current of $Q_3$ will reduce from its quiescent level of I to the value $(I-i)$. This same current $(I-i)$ will flow through $Q_1$. Since the current from source 12 is fixed at 2I, the remainder of the source current $(I+i)$ flows through $Q_2$ and $Q_4$. Accordingly, the circuit of FIG. 1 converts a single-sided input current into a pair of complementary currents in $Q_1$ and $Q_2$. This is a result of important utility in a variety of applications.

In practice, it is not possible for the circuit of FIG. 1 to hold the emitter of $Q_3$ exactly at ground potential, due to small mismatches in emitter areas. However, it is practical to maintain the emitter potential within about $\pm 0.2$ mV of ground. Thus the circuit provides a current-summing ground node 20 which has very low offset, and achieves this result without the use of complex circuitry. Of special value is the short high-frequency path which, together with the absence of lateral PNP transistors, ensures that the summing-node is generated with very wide bandwidth, i.e., the inductive component of the input impedance is very low.

Moreover, the input node 20 presents very low total input impedance. If beta were infinite, this impedance theoretically would be zero. For finite betas, it can be shown that the input impedance will be $4kT/qI\beta$. With a practical beta of 200, and a bias current $I=1$mA, the input impedance would be about 0.5 ohm. In some cases, this may have to be increased a small amount by the use, for topological or stability reasons, of base resistors for $Q_3$ and $Q_4$ (not shown in the drawing); typically, the increase might be another 0.5 ohm. Thus, a very simple four-transistor circuit offers an input resistance at the summing node of about 1.0 ohm, low enough for good accuracy in most applications where conversion from a voltage to a current is needed. Further, this impedance will remain low at relatively high frequencies.

FIG. 2 shows an arrangement wherein an output from the emitters of $Q_1$ and $Q_2$ of a cross-quad circuit 10 like that in FIG. 1 is coupled to emitter-follower circuitry generally indicated at 28. In this case the emitter-follower is a double follower, providing a desired amount of level shifting. Thus, the output loads $R_L$ can be driven at ground level. One characteristic of such circuitry, however, is that the base currents in $Q_9$ and $Q_{10}$ introduce some non-linearity in the relationship between input and output. Such non-linearity can be minimized by running the followers at high currents, but that tends to pose still other difficulties.

FIG. 3 shows a circuit for avoiding the non-linearity effects encountered with the FIG. 2 arrangement. The FIG. 3 circuit combines the cross-quad circuit 10 with a cross-quad differential emitter-follower generally indicated at 30. This combination serves to transfer the differential voltage $\Delta V$ from the voltage-to-current converter 10 to a pair of output lines 32 of the differential emitter-follower. $Q_{11}$ and $Q_{12}$ are matched, as are $Q_{13}$ and $Q_{14}$, so that the same $V_{BE}$ cancellation is achieved as in the FIG. 1 cross-quad circuit. The emitters of $Q_{13}$ and $Q_{14}$ are connected to constant-current sources $I_{e1}$ and $I_{e2}$ which also fix the respective currents through the upper pair $Q_{11}$ and $Q_{12}$. This circuit introduces very low error in the presence of base currents in an output pair, illustrated at 34, even when the emitter currents $I_e$ are very small. Almost perfect linearity can be achieved. Again, base resistors for $Q_{13}$ and $Q_{14}$ may be needed for topological and/or stability reasons.

One particularly valuable characteristic of this differential emitter-follower circuit is its low output impedance. The circuit behaves like a zero-output-resistance driver to the output pair 34. This is very important for high-accuracy applications. The circuit moreover provides $2V_{BE}s$ of level shifting, without however introducing distortion at low current levels, as in the FIG. 2 circuit.

Figure 4:
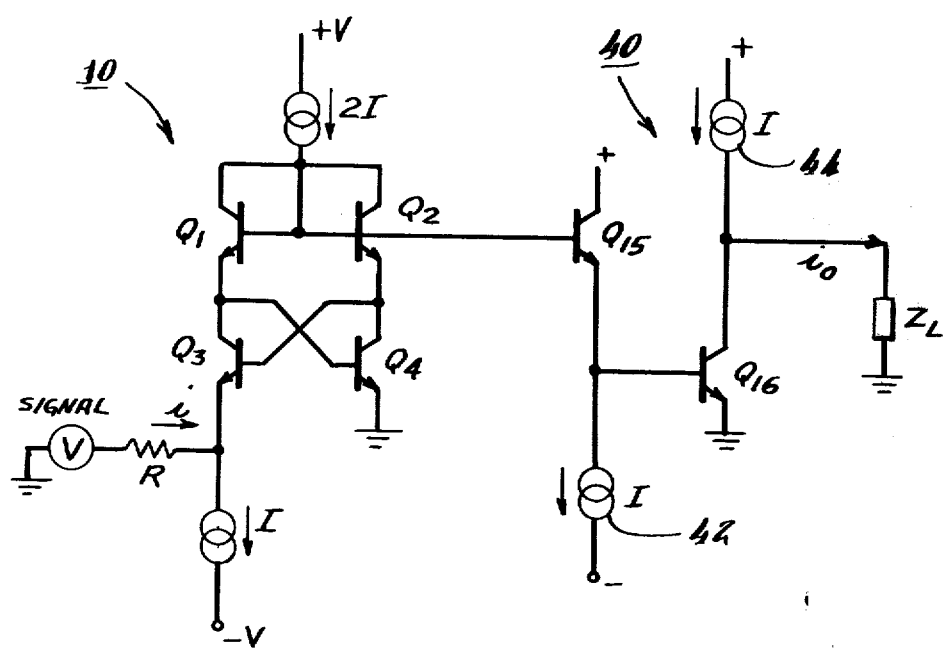
FIG. 4 shows a cross-quad coupled to further circuitry to provide a wide-band squarer.

FIG. 4 shows a cross-quad circuit 10 of the type described with reference to FIG. 1, but with the common base line of $Q_1$ and $Q_2$ driving a second circuit, generally indicated at 40, which serves with the cross quad 10 to effect a mathematical function, in this case squaring. This circuit includes a transistor $Q_{15}$ delivering current I to a constant-current source 42 connected to its emitter. This emitter also is connected to the base of another transistor $Q_{16}$, having a grounded emitter, and supplied with current from another constant-current source 44, producing a current I. An output current $i_o$ is drawn off from the collector of $Q_{16}$ and flows through a load $Z_L$.

The functioning of the FIG. 4 circuitry can best be analyzed by making use of the following principle which can be demonstrated to be applicable to translinear circuits: In a closed loop containing an even number of perfect logarithmic junctions arranged in voltage cancelling pairs, the junction currents are such that the product of all currents in junctions connected in one direction is exactly proportional to the product of all currents in junctions connected in the opposite direction, the constant of proportionality being the ratio of the product of the areas of the former set of junctions to the product of the areas of the latter set. This relationship is true independent of temperature, emission coefficient (m) and junction saturation current, provided all junctions have those factors in common.

Considering now the circuit of FIG. 4, and particularly the loop starting at the grounded emitter of $Q_{16}$, passing through $Q_{15}$ and $Q_1$, and back to ground through $Q_4$, it will be evident that the sum of the $V_{BE}s$ around that loop is zero. Therefore, by applying the above-defined relationship to that closed loop, the following equation can be developed for the products of the currents through the respective junctions (with the transistor corresponding to each junction current being indicated immediately below):

$$(I - i_o) \times (I) = (I - i) \times (I + i)$$
$$Q_{16} \quad\quad Q_{15} \quad\quad Q_1 \quad\quad Q_4$$
This gives: $I^2 - i_o I = I^2 - i^2$
so: $i_o = i^2/I$ Thus the quite simple circuitry of FIG. 4 is capable of accurately performing the mathematic operation of squaring. An important virtue of this circuitry lies in the fact that it simultaneously performs the tasks of voltage-to-current conversion and signal squaring at wide bandwidth, both normally difficult of achievement. It will be evident that different bias currents can be used to change the scaling and/or output offset as desired.

FIG. 5 shows still another application of the cross-quad type of circuit, that of providing a simple active rectifier. Here the emitters of $Q_3$ and $Q_4$ are interconnected through a resistor R. The base of $Q_2$ is grounded, and a single-sided voltage $E_{in}$ is applied to the base of Q₁. The output in this case is the collector current of Q₂.

Figure 6:
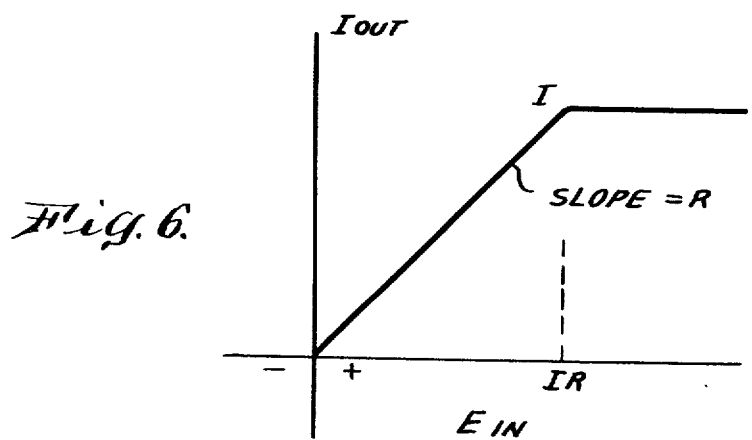
FIG. 6 is a graph illustrating the input/output characteristic of the circuit of FIG. 5.

FIG. 6 is a graph showing the relationship between the input voltage and the output current, and particularly shows the sharp break point that can be achieved when the input voltage reaches IR. The circuit can be extended to full-wave operation simply by repeating it with the input phase reversed.

Although several preferred embodiments of the invention have been disclosed herein in detail, it is to be understood that this is for the purpose of illustrating the invention, and should not be construed as limiting the scope of the invention since it is apparent that, to suit different applications, many changes can be made to the disclosed circuit arrangements by those skilled in the art while still making use of the inventive features disclosed herein.

I claim:

1. A signal-processing device incorporating a translinear circuit comprising:
   first and second matched PN junctions with input and output terminals;
   first current means supplying current to said junction input terminals;
   first and second matched transistors;
   the output terminal of said first junction being connected to the collector of said first transistor to supply the current of the first junction thereto;
   the output terminal of said second junction being connected to the collector of said second transistor to supply the current of the second junction thereto;
   means coupling the collector of said first transistor to the base of said second transistor;
   means coupling the collector of said second transistor to the base of said first transistor;
   means for fixing the emitter of said second transistor at a reference potential;
   an input circuit comprising means to supply to said first transistor emitter an input current corresponding to an input signal; and
   second current means connected to said first transistor emitter to establish the net emitter current as the transistor quiescent current plus (or minus) the input current from said input circuit.

2. A device as in claim 1, wherein said junction input terminals are connected together so that the current from said first current means divides between said junctions.

3. A device as in claim 2, wherein said first current means provides a constant current of magnitude designated 2I; and
   said second current means comprises a constant current source providing a quiescent current through said first transistor of magnitude designated I, whereby the quiescent currents through said first and second transistors are equal.

4. A device as in claim 2, wherein said junctions are formed as third and fourth transistors having their collectors and bases connected together.

5. A signal-processing device including a differential emitter-follower circuit comprising:
   first and second matched transistors having their collectors coupled to supply voltages;
   third and fourth matched transistors;
   the emitter of said first transistor being connected to the collector of said third transistor;
   the emitter of said second transistor being connected to the collector of said fourth transistor;
   means coupling the emitter of said first transistor to the base of said fourth transistor;
   means coupling the emitter of said second transistor to the base of said third transistor;
   output circuit means coupled to the emitters of said third and fourth transistors to develop an output voltage corresponding to the potential difference between those emitters;
   input circuit means for coupling an input voltage differentially between the bases of said first and second transistors; and
   first and second constant-current sources connected to the emitters of said third and fourth transistors and operable to maintain constant currents through the emitters of said third and fourth transistors and through the emitters of said first and second transistors.

6. A device as in claim 5, wherein said output circuit means applies said output voltage between the bases of a differential pair of transistors.

7. A signal-processing device incorporating translinear circuitry comprising:
   (A) a first cross-quad circuit having:
   first and second matched PN junctions with input and output terminals;
   first current means supplying current to said junction input terminals;
   first and second matched transistors;
   the output terminal of said first junction being connected to the collector of said first transistor to supply the current of the first junction thereto;
   the output terminal of said second junction being connected to the collector of said second transistor to supply the current of the second junction thereto;
   means coupling the collector of said first transistor to the base of said second transistor;
   means coupling the collector of said second transistor to the base of said first transistor;
   means for applying an input signal to said first cross-quad circuit and for developing a differential output signal therefrom;
   (B) a second cross-quad circuit providing a differential emitter-follower and comprising:
   third and fourth matched transistors having their collectors coupled to supply voltage;
   means coupling said output voltage between the bases of said third and fourth transistors;
   fifth and sixth matched transistors;
   the emitter of said third transistor being connected to the collector of said fifth transistor;
   the emitter of said fourth transistor being connected to the collector of said sixth transistor;
   means coupling the emitter of said third transistor to the base of said sixth transistor;
   means coupling the emitter of said fourth transistor to the base of said fifth transistor;
   output circuit means coupled to the emitters of said fifth and sixth transistors to develop an output voltage corresponding to said output signal; and
   first and second constant-current sources connected to the emitters of said fifth and sixth transistors and operable to maintain constant currents through the emitters of said fifth and sixth transistors and thereby to maintain constant currents through the emitters of said third and fourth transistors.

8. A device as in claim 7, including:

an input circuit comprising means to supply to said first transistor emitter an input current corresponding to an input signal; and second current means connected to said first transistor emitter to establish the net emitter current therethrough as the quiescent current of said first transistor plus (or minus) the input current from said input circuit.

9. A device as in claim 7, including an output pair of transistors;

said output circuit means including means for connecting said emitters of said fifth and sixth transistors respectively to the bases of said transistors of said output pair.

10. A squarer comprising:

(A) a cross-quad circuit including:

first and second matched forward-biased PN junctions with input and output terminals;

said input terminals being connected together;

first current means supplying current to said junction input terminals;

first and second matched transistors;

the output terminal of said first junction being connected to the collector of said second transistor to supply the current of the second junction thereto;

the output terminal of said second junction being connected to the collector of said second transistor to supply the current of the second junction thereto;

means coupling the collector of said first transistor to the base of said second transistor;

means coupling the collector of said second transistor to the base of said first transistor;

means for applying an input signal to said cross-quad circuit and for developing a corresponding output signal at the input terminals of said junctions; and (B) a second circuit including:

a third forward-biased PN junction having its input terminals coupled to the input terminals of said first and second junctions;

second current means supplying current to said third junction;

a fourth forward-biased PN junction having its input terminal connected to the output terminal of said third junction;

third current means supplying current to said fourth junction; and means diverting a portion of the current from said third current means to provide an output current to a load element.

11. A device as in claim 10, wherein said output terminal of said fourth junction is maintained at the same potential as the emitter of said second transistor.

12. A device as in claim 11, including an input circuit supplying an input current to the emitter of said first transistor; and fourth current means connected to said first transistor emitter and establishing the current through that emitter as the quiescent current for the transistor plus (or minus) the input current.

13. A device as in claim 12, wherein all of said junctions are part of bipolar transistors, with the collectors connected to the corresponding bases to serve as said input terminals, and the emitters serving as said output terminals.

14. A device as in claim 13, wherein all of said current means comprise constant-current sources producing currents in predetermined ratios.

15. An active rectifier device comprising:

first and second matched transistors having their collectors coupled to supply voltages;

third and fourth matched transistors;

the emitter of said first transistor being connected to the collector of said third transistor;

the emitter of said second transistor being connected to the collector of said fourth transistor;

means coupling the emitter of said first transistor to the base of said fourth transistor;

means coupling the emitter of said second transistor to the base of said third transistor;

input circuit means for coupling an input voltage differentially between the bases of said first and second transistors;

a resistor connected between the emitters of said third and fourth transistors;

a constant-current source connected to the emitter of said third transistor and operable to maintain a constant total current through the emitter of said third transistor and said resistor;

the collector current of said second transistor serving as an output signal responsive to said input voltage.

16. The rectifier of claim 15 wherein the base of said second transistor is held at a fixed reference potential and said input voltage is applied single-sidedly to the base of said first transistor.

* * * * *